(12) United States Patent
Siebold

(10) Patent No.: US 8,294,455 B2
(45) Date of Patent: Oct. 23, 2012

(54) ARRANGEMENT FOR DETECTING THE CHANGE IN A RELATIVE POSITION OF TWO PARTS IN RELATION TO ONE ANOTHER

(75) Inventor: Carsten Siebold, Gilching (DE)

(73) Assignee: Siemens Aktiengesellschaft, München (DE)

( * ) Notice: Subject to any disclaimer, the term of this patent is extended or adjusted under 35 U.S.C. 154(b) by 676 days.

(21) Appl. No.: 11/922,151

(22) PCT Filed: Apr. 20, 2006

(86) PCT No.: PCT/EP2006/061685
§ 371 (c)(1),
(2), (4) Date: Jan. 11, 2010

(87) PCT Pub. No.: WO2006/133984
PCT Pub. Date: Dec. 21, 2006

(65) Prior Publication Data
US 2010/0102798 A1   Apr. 29, 2010

(30) Foreign Application Priority Data
Jun. 17, 2005   (DE) .......................... 10 2005 028 183

(51) Int. Cl.
*G01B 7/14* (2006.01)
(52) U.S. Cl. ............... 324/207.11; 324/207.14; 384/448
(58) Field of Classification Search ........ 324/207.11–207.25; 384/448
See application file for complete search history.

(56) References Cited

U.S. PATENT DOCUMENTS

| | | | |
|---|---|---|---|
| 4,542,337 A | 9/1985 | Rausch | |
| 4,588,949 A | 5/1986 | Becker et al. | |
| 5,512,738 A | 4/1996 | Yuen | |
| 6,282,942 B1 * | 9/2001 | Husby | 73/12.04 |
| 6,360,610 B1 * | 3/2002 | Jarzynski et al. | 73/627 |
| 6,529,140 B1 * | 3/2003 | Sax et al. | 340/870.33 |
| 2002/0097040 A1 * | 7/2002 | Takizawa et al. | 324/174 |
| 2004/0066185 A1 * | 4/2004 | Csikos et al. | 324/207.12 |
| 2005/0012716 A1 * | 1/2005 | Mikulin et al. | 345/163 |
| 2009/0027043 A1 * | 1/2009 | Pelak et al. | 324/207.2 |

FOREIGN PATENT DOCUMENTS

| | | |
|---|---|---|
| DE | 941 080 | 4/1956 |
| EP | 0 035 323 A1 | 9/1981 |

* cited by examiner

*Primary Examiner* — Arleen M Vazquez

(57) ABSTRACT

There is described an arrangement for detecting a change in a position between two parts which can be displaced in relation to one another. The arrangement has at least one electromechanical registering device having a monitoring chamber, which is shielded from manipulations taking effect from the outside, a number of monitoring bodies in the monitoring chamber, the number comprising at least two components and these components differing from one another in terms of a physical parameter, motion transfer means, which, in the event of the change in the positioning being returned to an initial state, cause the monitoring bodies to be moved from a first monitoring arrangement into a second monitoring arrangement. A sensor device has sensors which generate a sensor signal corresponding to the physical parameter of a monitoring body associated with each sensor in the first and second monitoring arrangement, and each sensor signal is fed to an evaluation unit.

13 Claims, 4 Drawing Sheets

ARRANGEMENT FOR DETECTING THE CHANGE IN A RELATIVE POSITION OF TWO PARTS IN RELATION TO ONE ANOTHER

CROSS REFERENCE TO RELATED APPLICATIONS

This application is the US National Stage of International Application No. PCT/EP2006/061685, filed Apr. 20, 2006 and claims the benefit thereof. The International Application claims the benefits of German application No. 10 2005 028 183.4 DE filed Jun. 17, 2005, both of the applications are incorporated by reference herein in their entirety.

FIELD OF INVENTION

The invention relates to an arrangement for detecting the change in the positioning between two parts which can be displaced in relation to one another.

BACKGROUND OF INVENTION

It is generally known that measuring devices which register energy consumption, such as for example electricity meters, water meters or gas meters, are secured by means of metal seals. Also security transport containers, containers and areas to which unauthorized persons have no access are sealed by means of metal seals or other seals, for example self-adhesive seal labels known as "VOID Labels". A metal seal frequently consists of a security loop made of wire, which then passes through holes of the object to be secured and the point of intersection of which is then enclosed by stamping a piece of lead. A break in the metal seal may only be determined in situ. If the seal was broken open and replaced by a forged one or if the seal broken open beforehand was re-sealed by skillful handling and the application of a suitable tool, this unauthorized access can however no longer be determined unequivocally.

In order to determine whether the casing of an electrical device was opened, so-called "Case-Open-Switches" are also used, the status of which is interrogated and stored within a logic backup battery arrangement.

In order to protect safety-critical electrical devices such as for example terminals, which are used for financial transactions, against an unauthorized access, the use of coded seals is furthermore well-known, which can be affixed to the line of separation between the parts of the casing and monitored electrically.

A coded seal known from U.S. Pat. No. 5,512,738 exhibits a conductivity pattern which is affixed over a line of separation between both parts of the casing and which breaks when the parts of the casing are opened. A monitoring circuit in the device monitors the soundness of this seal. The disadvantage is that the seal can be used only once. A destroyed seal must be removed manually and replaced by a new seal. A further disadvantage is that the seal is affixed from the outside, so that despite coding it is not to be excluded that the monitoring circuit is short-circuited from the outside prior to an improper access.

There are applications in which not only a high safety demand is made, but it is also desired that an opened seal can return to its original state without being destroyed. In this process, it should not be possible to identify the specific status of the seal so easily from the outside. For the maintenance of the functional state of the seal, no auxiliary energy should be necessary so that even in the current-free state of the device, the seal can be verified remotely.

Such an application is present for example in systems which contain or process confidential information and where an unauthorized access is to be detected so as to provide maximum security against forgery. It should also be possible to detect an unauthorized access if the device was in a current-free state for an extended period of time or is still in this state at the time of the check. A further application is evidence when settling warranty claims which is always based on whether it can be conclusively proved that the casing of a device was opened and therefore unauthorized manipulation within the device cannot be excluded.

SUMMARY OF INVENTION

Hence the aim of the invention is to create a protection device which reliably registers the change in the relative position of two parts without using auxiliary energy, which is to a large extent forgery-proof and with which the information status can also be consulted remotely without a great deal of complexity and can also again be reset from there.

An object underlying the invention is to provide an arrangement by means of which the change in the relative position of two parts can to a large extent be detected in a forgery-proof manner, it being possible that the information status can be remotely monitored electrically and can again be reset after a change has taken place without auxiliary energy being necessary in situ and which is as economical as possible to manufacture.

The object is achieved by the provision of an arrangement in accordance with the features of an independent claim. Advantageous embodiments form the subject matter of independent claims.

The invention is based on the idea of the working principle of an electromechanical seal, in which the change in the relative position of the parts to be monitored is first of all registered mechanically and the mechanically registered information status is subsequently evaluated further electronically. In the teaching being implemented—triggered by the change in the relative position—a spatial arrangement of monitoring bodies, which are in a protected area, is transferred from an initial arrangement to a random arrangement, provision being made for detectors which detect the ordering states by means of signal processing.

The invention makes provision for an arrangement for detecting the change in the positioning between two parts which can be displaced in relation to one another, comprising:
  at least one electromechanical registering device having a monitoring chamber, which is shielded from manipulations effected from the outside,
  a number of monitoring bodies in the monitoring chamber, it being possible that the number of monitoring bodies consists of at least two components and these components differ from one another in terms of a physical parameter,
  motion transfer means, which, in the event of a change in the positioning being returned to an initial state, cause the monitoring bodies to be moved from a first monitoring arrangement into a second monitoring arrangement,
  a sensor device having sensors which generate a sensor signal corresponding to the physical parameter in the first monitoring arrangement and in the second monitoring arrangement,
  an evaluation unit to which each sensor signal of the at least one electromechanical registering device is fed.

The advantages mainly obtained with the invention are especially to be seen in the high security against forgery. Even if the mechanical registering device is opened by force, it is difficult to restore the ordering state of the monitoring bodies with a reasonable amount of effort. A further substantial advantage is to be seen in the non-destructive method of working. This makes it possible for the registering device to be reset again with ease by an authorized party, i.e. to be again made ready for use. The evaluation of the sensor signals can be carried out in a conventional manner via a digital circuit, such as for example a microprocessor. Manufacture is simple and requires comparatively few resources.

The electrical or optical conductivity is preferably monitored as a physical parameter, which can simply be done by embodying the sensors as electrical contacts or photoelectric cells, or the magnetic property for the detection of which Hall sensors or reed contacts can for example be used in each case.

BRIEF DESCRIPTION OF THE DRAWINGS

For further explanation of the invention, the following part of the description refers to the drawings, from which further advantageous embodiments, details and developments of the invention will emerge. They are as follows.

DETAILED DESCRIPTION OF INVENTION

Figure 1:
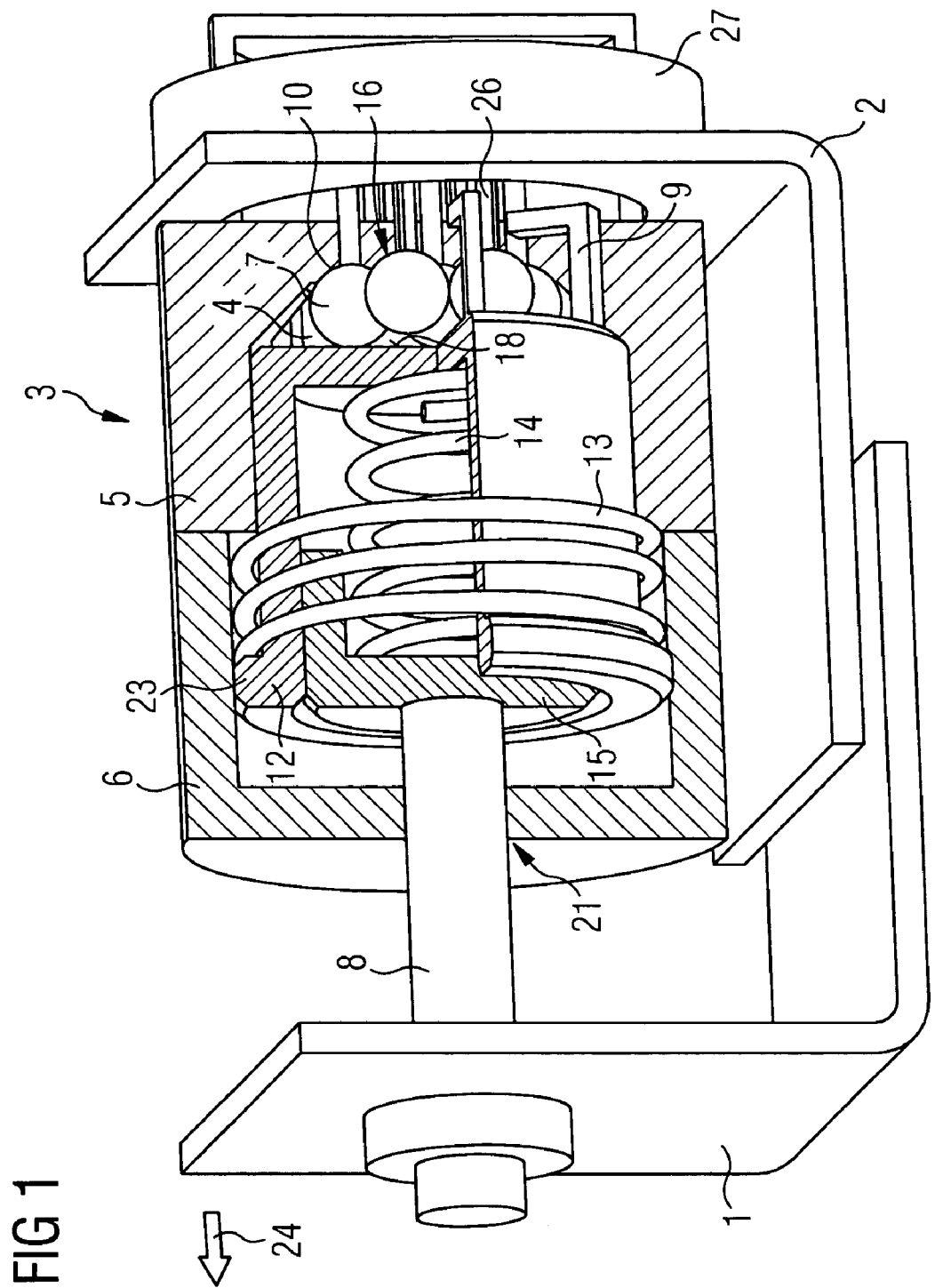
FIG. 1 a first exemplary embodiment of the invention in a partially sectioned view in a state before the change in the relative position of the two parts.

FIG. 1 shows a first exemplary embodiment of the invention and how it is for example used for registering an unauthorized opening of a casing of an electrical device. In FIG. 1 two parts which can be displaced in relation to one another are referred to with the reference symbol 1 and 2 and are connected to the parts of a casing not represented in detail (e.g. casing door and chassis) of an electrical device to be monitored. The reference symbol 3 refers to an entire electromechanical registering device. The registering device 3 consists of a monitoring chamber 4, a number of monitoring bodies 7, a sensor device 16 and motion transfer means described in more detail below, which transfer a change in the position of parts 1, 2 in relation to one another to the arrangement of the monitoring bodies 7 in the monitoring chamber 4. In the illustrated exemplary embodiment, the monitoring chamber 4 is formed by a first and a second annular cylinder 5, 12. Each of the annular cylinders 5, 12 is closed at an end surface and is pot-shaped. The closed end surface of the second annular cylinder 12 protrudes into the first annular cylinder 5. The internal surface of a cylinder of the first annular cylinder 5 forms a guide face 19 for the second annular cylinder 12 so that the latter is guided in an axially displaceable manner in the first annular cylinder 5. The volume of the space occupied by the monitoring chamber 4 is thus determined by the axial position of the second annular cylinder 12 in the first annular cylinder 5. FIG. 1 illustrates the scenario before the change in the relative position of the two parts 1 and 2. Two springs 13 and 14 prestressed in opposite directions determine the axial position of the two annular cylinders 5, 12 in relation to one another. In this process, the outer spring 13 is supported and prestressed between a projection of the first annular cylinder 5 and a collar 23 of the second annular cylinder 12. The prestressing is generated via an internal spring 14, which is connected to the part 1 by means of a piston 15 of a piston rod 8. The piston 15 is guided in the second annular cylinder 12 by means of a second guide face 20.

Figure 3:
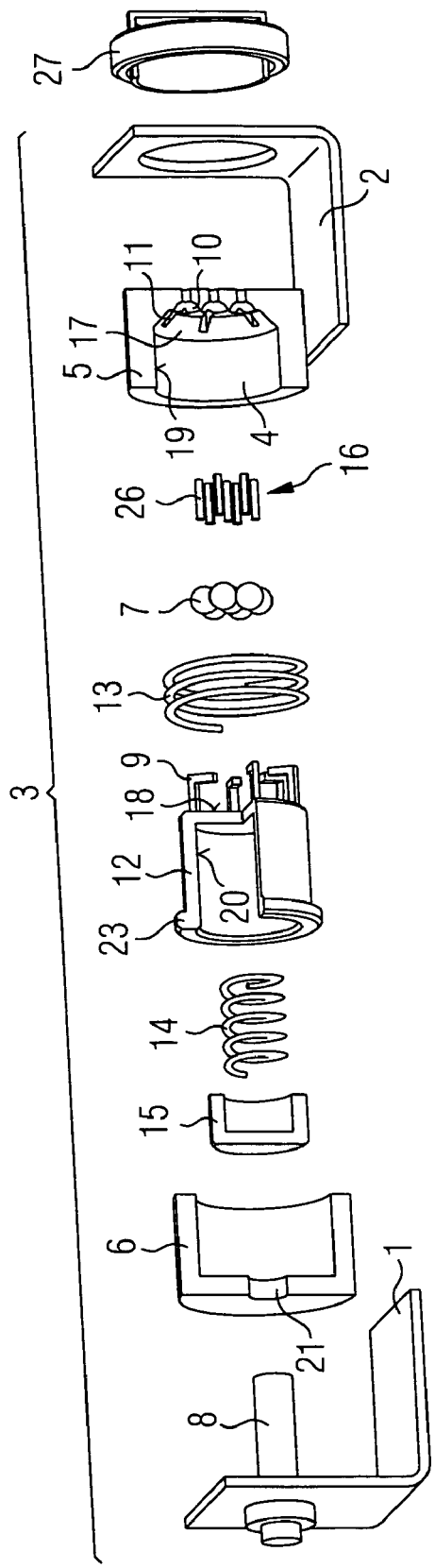
FIG. 3 an exploded view of the first exemplary embodiment of the invention.

As can easily be recognized in FIG. 1, each monitoring body 7 has the shape of a ball. Seven balls 7 can be seen in the chamber 4 (FIG. 3). The diameter of these seven balls 7 is more or less equal. Among the seven balls 7 there are two types of ball 7, which differ from one another in terms of a physical parameter. In the present exemplary embodiment, the parameter characterizing the balls 7 is electrical conductivity, i.e. four balls are electrically conductive and the remaining three balls are manufactured from an electrical insulator. In FIG. 1, these balls 7 are illustrated in a monitoring arrangement, in which, when seen in a spatial manner, said balls 7 are arranged in one level along a peripheral circle. This level lies more or less parallel to the end face 18 of the second annular cylinder 12. The peripheral distance between the balls 7 is determined by segment-shaped dents 10 in the contact area 17 of the first annular cylinder 5. The shape of said dents 10 is more or less adapted to the diameter of the balls 7. The peripheral distance between the balls 7 is more or less equal in the monitoring arrangement. In the monitoring arrangement, each ball 7, when seen in a spatial manner, is situated in a test position. Each ball 7 that is situated in the test position lies in the detection range of a sensor 26 that is provided in the first annular cylinder 5. The contact to each sensor 26 is generated by the force of the prestressed spring 14, which presses the front face 18 of the second annular cylinder 12 onto the arrangement of the monitoring bodies 7 and, as a result, remains in contact with the contact area 17 (FIG. 3). Each ball 7 bridges the gap between the dent 10 and the end face 18. On the basis of prestressing the inner spring 14, the arrangement of the balls 7 in the test position is to a large extent insensitive to vibrations taking effect from the outside. Because of the sensors 26, the electrical conductivity of the balls 7 assigned to the specific sensor 26 can be monitored, it being possible that the sensor signal from each sensor 26 is to be fed to the evaluation unit 27 connected downstream. The entire assembly for the transfer of motion to the monitoring chamber 4 is covered by a housing cylinder 6. The housing cylinder 6 exhibits a bore 21, the diameter of which is exactly adapted to the diameter of the piston rod 8 so that the piston 15 cannot be blocked from the outside. The materials of the parts surrounding the monitoring chamber 4 are designed in such a way that the motion transfer elements of the assembly or the transfer elements 7 are themselves protected from manipulation effected from the outside.

Figure 2:
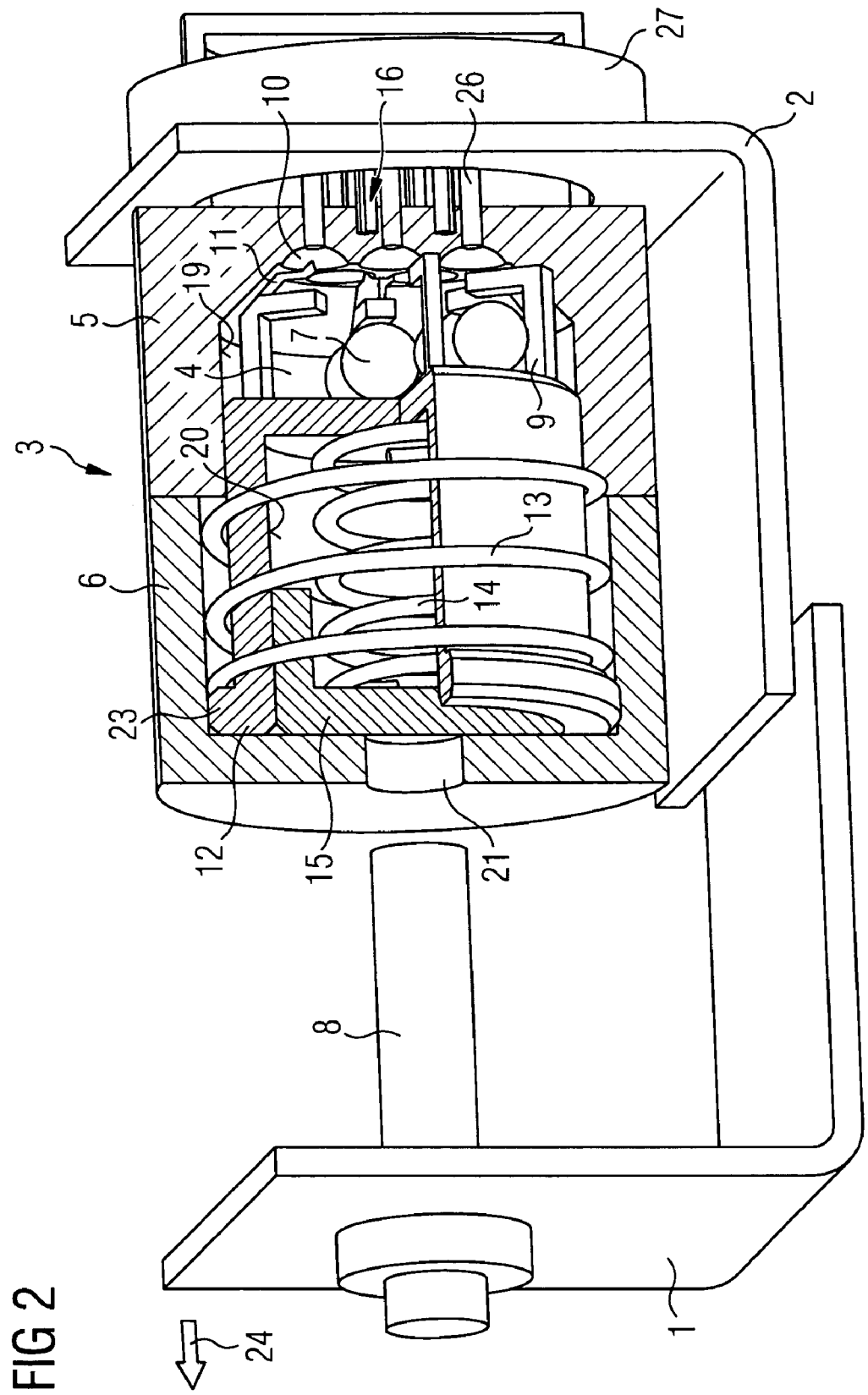
FIG. 2 the exemplary embodiment in accordance with FIG. 1, in a state in which one of the two parts is distant from the other part.

If a change in the positioning between parts 1 and 2 in relation to one another takes place (this is indicated by arrow 24 in FIGS. 1 and 2), then this change in a position is transferred by motion means, i.e. via the piston rod 8, the piston 15 and the inner spring 14 to the arrangement of the balls 7. The change in a position of part 1, from right to left, first of all causes the spring pressure, exerted by the inner spring 13 on the second annular cylinder 12, to be eased. The springs 13 and 14 are adjusted in such a way that the second annular cylinder 12 begins to move in the direction of the arrow 24 from a threshold value that can be predefined by the spring constants, and—guided by the guide face 19 in the first annular cylinder 5—is pushed out from the first annular cylinder 5 in telescopic fashion (in FIG. 1 from right to left). Mixer hooks 9 pointing in an axial direction to the chamber are affixed to the second annular cylinder 12, and are accommodated, in the shown position, in recesses 11 (FIG. 2) in the first annular cylinder 5. Said mixer hooks 9 engage behind the balls 7 in the monitoring arrangement, so that an axial displacement of the second annular cylinder 12 in the direction of the arrow 24 causes the mixer hooks 9 to lift the balls 7 out of their test position. For this reason, it is ensured that in the case of a sufficiently large change in a position of parts 1 and 2 in each assembled position of the registering device 3, the contact making with the sensors 26 is lost. The balls 7 leave the detection range of the sensors 26. The electrical monitoring circuit is interrupted. In the illustrated embodiment, the balls 7 fall downward under the effect of gravitation into the monitoring chamber 4. This scenario in which part 1 was shifted part of the way away from the part 2 in the direction of the arrow 24, is illustrated in FIG. 2.

If the original state of parts 1 and 2 in relation to one another is now again restored, i.e. the first part 1 is again shifted back in the opposite direction to the arrow 24, then the end face 18 of the second annular cylinder 12 again pushes the unordered cluster of balls 7, which bears against a lower section of the cylinder surface 19, into the test position. The balls 7 again bear against the end face 18 of the monitoring chamber 4 at the end. Each of the balls is now again situated in a test position predefined by the segment-shaped dents 10. The balls 7 were thus moved into a second monitoring arrangement. This second monitoring arrangement of the balls 7 corresponds graphically to the representation in FIG. 1. However, in contrast, the balls 7—compared to the first monitoring arrangement (before the change in a relative position of parts 1 or 2)—are now randomly arranged at different places. According to sheer coincidence, each of the sensors 26 now detects another physical parameter. In other words, in the monitoring chamber 4 an irreversible change in an information status has now taken place. The specific information status, in the case of a corresponding embodiment of the balls 7, cannot be identified purely externally; however, the information status can be evaluated in terms of measuring technology by the sensors 26. A binary value of a code is assigned to each sensor signal, i.e. in the case in question, in which the balls 7 are conductive or non-conductive, the local information status is interpreted as the logic state "1" or the logic state "0". Or put in another way: an initial code was converted into a random code after the change in a position of parts 1 and 2.

In order to detect the information status electrically, the sensors 26, to be precise, must be active, but the registering takes place mechanically and requires no auxiliary energy. As a result, a non-destructive resetting of the code can simply be effected by authorized service personnel defining an adjusted position profile of the balls 7 as a new initial state, i.e. assigning an initial code to said state.

Depending on the number of balls 7 and the monitored physical parameters, an almost arbitrarily high security against forgery can be achieved. Even if outside force is used to gain access to the balls 7, their original arrangement is difficult to restore. In the present application, in which the registering device 3 is connected to the door or to the chassis of an electrical device, proof can very easily be provided by means of the arrangement according to the invention as to whether the casing was open at any point in time and as to whether warranty claims exist.

In the present exemplary embodiment, the evaluation unit 27 and the electromechanical registering device 3 are integrated. The evaluation unit 27 can of course be accommodated completely or partially in a locally split device. The evaluation unit 27 has a microprocessor. The code, which describes the ordering state of the balls 7 in the chamber 4, can for example be stored in the firmware (for example BIOS).

Said code is preferably stored in an encrypted or scrambled manner. If the monitoring software in the evaluation unit 27, identifies that a code given by the factory was changed, i.e. an unauthorized opening took place, then different security measures can be taken depending on the application. For example, the operation of the device can be blocked, an alarm message conveyed to a higher-level control center or an entry made in a journal. The arrangement can only be put back again and restored to its original state at the factory or by authorized service personnel in situ. Therefore, the arrangement according to the invention operates in the manner of a non-destructive electrical seal. The invention makes it possible to create a security system by means of which the event of the change in a relative position of two parts can be traced back in a non-destructive manner and without battery backup.

Figure 4:
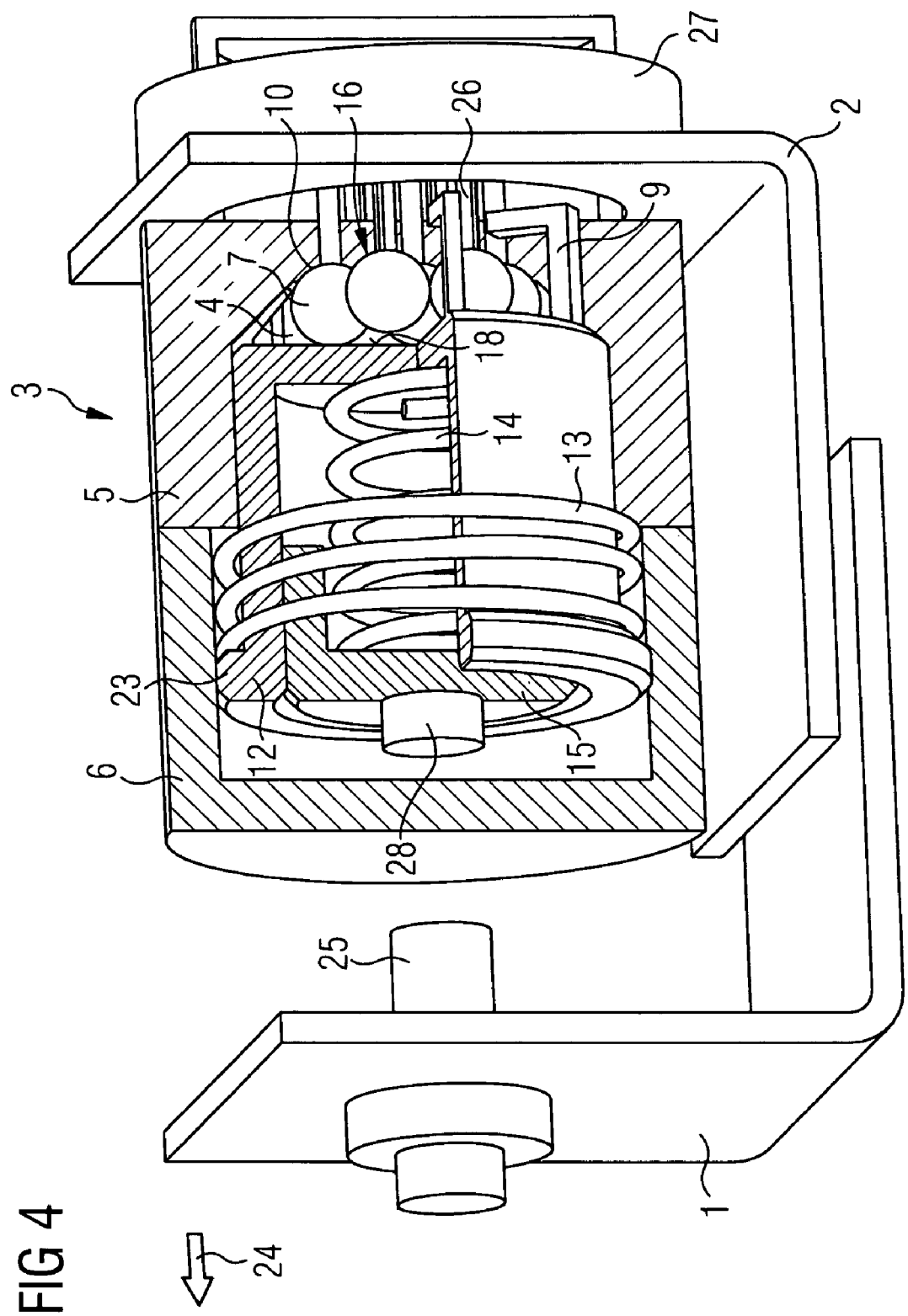
FIG. 4 a second exemplary embodiment of the invention in a partially sectioned view in a state before the change in the relative position of the two parts.

FIG. 4 shows a second exemplary embodiment of the invention. This second exemplary embodiment differs from the first embodiment with regard to the motion transfer means, which transfer the change of position of the parts 1, 2 to the chamber 4. An arrangement of two permanent magnets 25, 28 is used here in place of the piston rod 8. The permanent magnet 25 is connected to the first part 1. The permanent magnet 28 is fastened to an outer end face 18 on the piston 15. The end wall of the cylinder casing 6 consists of a magnetically non-conductive material, i.e. the magnetic field of the magnets 25, 28 can pass the end wall of the cylinder casing 6 in an unhindered manner. The magnets 25, 28 are magnetized in such a way that poles of the same sign are formed at the end side. As a result, the change in the relative position of parts 1 and 2 in relation to one another is transferred contact-free through the end wall of the cylinder casing 6. Since the cylinder casing 6 in this second exemplary embodiment has no openings whatsoever and the first annular cylinder 5 also has no opening to the outside, the ordering state of the monitoring elements 7 in the monitoring chamber 4 is hermetically sealed and cannot be influenced from the outside. With this embodiment, provision can of course also be made for a plurality of these registering devices 3 in the case of an object to be secured.

The invention claimed is:
1. An arrangement for detecting a displacement of two parts in relation to one another, comprising:
   a monitoring chamber;
   a plurality of monitoring bodies in the monitoring chamber, wherein the plurality of monitoring bodies are of at least two types, wherein the types differ from one another based on a physical parameter;
   a motion transfer device to move the monitoring bodies from a first monitoring arrangement into a second monitoring arrangement if the two parts are returned to an initial state after changing the position of the two parts;
   a sensor device with sensors
   to generate a sensor signal corresponding to the physical parameter of the monitoring bodies in a first monitoring arrangement, and
   to generate a sensor signal corresponding to the physical parameter of the monitoring bodies in a second monitoring arrangement; and
   an evaluation device, wherein the sensor signal is transmitted to the evaluation device,
   wherein each monitoring body has a shape of a ball,
   wherein the monitoring chamber is formed by a cylinder chamber of a first annular cylinder closed on one side and by an end face of a second annular cylinder, wherein the second annular cylinder is displaceable in an axial direction in the cylinder chamber, and wherein the first annular cylinder and the second annular cylinder are connected, and wherein the balls are held in contact with each other based on a clamping force of a spring between the end face and a contact area at the first annular cylinder in the first monitoring arrangement and in the second monitoring arrangement.

2. The arrangement as claimed in claim 1, wherein the contact area has segment-shaped dents to accommodate the balls in the first monitoring arrangement and in the second monitoring arrangement, and wherein the sensors are spatially assigned to the segment-shaped dents.

3. The arrangement as claimed in claim 1, further comprising an outer spring on an outer peripheral side of the second annular cylinder, wherein the outer spring is supported at the first annular cylinder and at the second annular cylinder, and wherein the outer spring is prestressed in an initial position.

4. The arrangement as claimed in claim 1, wherein the sensors and the evaluation device are connected via lines, and wherein sensors and the evaluation device are situated in separate locations.

5. The arrangement as claimed in claim 4, wherein the evaluation device and the sensors are integrated on an ASIC.

6. The arrangement as claimed in claim 1, wherein the evaluation device assigns a binary code to the balls in the first monitoring arrangement, wherein the evaluation device assigns a binary code to the balls in the second monitoring arrangement, and wherein the binary code is determined by the physical parameter detected in the first monitoring arrangement and in the second monitoring arrangement.

7. The arrangement as claimed in claim 6, wherein the code is transmitted via the lines based on encrypted signals.

8. The arrangement as claimed in claim 7, wherein the code is stored in a firmware, a BIOS or in a memory of an operating system of a computer.

9. The arrangement as claimed in claim 6, wherein the code is stored in a firmware, a BIOS or in a memory of an operating system of a computer.

10. The arrangement as claimed in claim 1, wherein the monitoring chamber is shielded from manipulation effected from outside the chamber, wherein the sensors generate sensor signal corresponding to the physical parameter of each monitoring body, and wherein each sensor signal is transmitted to the evaluation device.

11. The arrangement as claimed in claim 1, wherein the physical parameter is an electrical conductivity of the monitoring bodies.

12. The arrangement as claimed in claim 1, wherein the physical parameter is determined by an optical conductivity of the monitoring bodies.

13. The arrangement as claimed in claim 1, wherein the physical parameter is a magnetic material property of the monitoring bodies.

* * * * *

UNITED STATES PATENT AND TRADEMARK OFFICE
CERTIFICATE OF CORRECTION

PATENT NO. : 8,294,455 B2
APPLICATION NO. : 11/922151
DATED : October 23, 2012
INVENTOR(S) : Carsten Siebold It is certified that error appears in the above-identified patent and that said Letters Patent is hereby corrected as shown below:

Col. 8, line 22, remove [determined by]

Signed and Sealed this
Nineteenth Day of February, 2013

Teresa Stanek Rea
*Acting Director of the United States Patent and Trademark Office*